US009047428B2

(12) United States Patent
Nimoda et al.

(10) Patent No.: US 9,047,428 B2
(45) Date of Patent: Jun. 2, 2015

(54) DETERMINING METHOD, COMPUTER PRODUCT, AND DETERMINING APPARATUS

(71) Applicant: FUJITSU SEMICONDUCTOR LIMITED, Yokohama-shi, Kanagawa (JP)

(72) Inventors: Eiichi Nimoda, Hachioji (JP); Natsumi Saito, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/464,737

(22) Filed: Aug. 21, 2014

(65) Prior Publication Data

US 2015/0074626 A1    Mar. 12, 2015

(30) Foreign Application Priority Data

Sep. 12, 2013   (JP) ................. 2013-189861

(51) Int. Cl.
G06F 9/455      (2006.01)
G06F 17/50     (2006.01)

(52) U.S. Cl.
CPC .................... *G06F 17/504* (2013.01)

(58) Field of Classification Search
CPC ...................... G06F 17/504; G06F 17/5022
USPC ....................................................... 716/107
See application file for complete search history.

(56) References Cited

U.S. PATENT DOCUMENTS

| 6,216,256 | B1 * | 4/2001 | Inoue et al. ............. 716/114 |
| 6,347,392 | B1 * | 2/2002 | Gaultier ................. 716/101 |
| 6,658,635 | B1 * | 12/2003 | Tanimoto ............... 716/108 |
| 2003/0046644 | A1 * | 3/2003 | Wheeler et al. ........... 716/5 |

FOREIGN PATENT DOCUMENTS

| JP | 10-326301 | 12/1998 |
| JP | 2009-48312 | 3/2009 |
| JP | 2011-203962 | 10/2011 |

OTHER PUBLICATIONS

Patent Abstracts of Japan, Publication No. 10-326301, published Dec. 8, 1998.
Patent Abstracts of Japan, Publication No. 2009-048312, published Mar. 5, 2009.
Patent Abstracts of Japan, Publication No. 2011-203962, published Oct. 13, 2011.

* cited by examiner

*Primary Examiner* — Suresh Memula
(74) *Attorney, Agent, or Firm* — Staas & Halsey LLP

(57) ABSTRACT

A determining method includes obtaining terminal information indicating a first object terminal that is among terminals included among partial circuits and subject to determination of whether the first object terminal is an open terminal; obtaining for each terminal, connection information and first attribute information indicating an attribute of any one among an input terminal and an output terminal; generating, by a computer, for each terminal, second attribute information indicating an attribute opposite to the attribute indicated by the first attribute information; and determining, by the computer, whether a state of the first object terminal indicated by the terminal information becomes a high-impedance state, by simulating on the basis of the connection information and the second attribute information, a state of each terminal when a value of a terminal among the terminals and indicated as an output terminal by the second attribute information, is set at a first specified value.

12 Claims, 19 Drawing Sheets

MODULE X

| PortName | Bit | I/O | Connection | Note |
|---|---|---|---|---|
| Port_A | 1 | Out | MODULE Y.Port_D | CONNECT TO Port_D OF MODULE Y |
| Port_B | 1 | In | 1'b1 | CLIP BY FIXED VALUE 1'b1 |
| Port_C | 1 | Out | OPEN | DO NOT CONNECT WITH TERMINAL |

511

MODULE Y

| PortName | Bit | I/O | Connection | Note |
|---|---|---|---|---|
| Port_D | 1 | In | MODULE S.Port_A | CONNECT TO Port_A OF MODULE X |
| Port_E | 1 | In | 1'b0 | CLIP BY FIXED VALUE 1'b0 |

FIG.10

```
Check_moduleX_Port_C : assert always
((MODULE X.Port_C) === (1'bz) ) ;
```

1000

```
module MODULE Z(-TERMINAL DECLARATION STATEMENT OMITTED-);
-TERMINAL DECLARATION STATEMENT OMITTED-
wire sig_Number1;
wire sig_Number2; // OPEN ERRANT, CONNECT TO Port_E
MODULE X inst_MODULE X(
 .Port_A(sig_Number1),
 .Port_B(1'b1),
 .Port_C(sig_Number2)
);
MODULE Y inst_MODULE Y(
 .Port_D(sig_Number1),
 .Port_E(sig_Number2)
);
endmodule
```

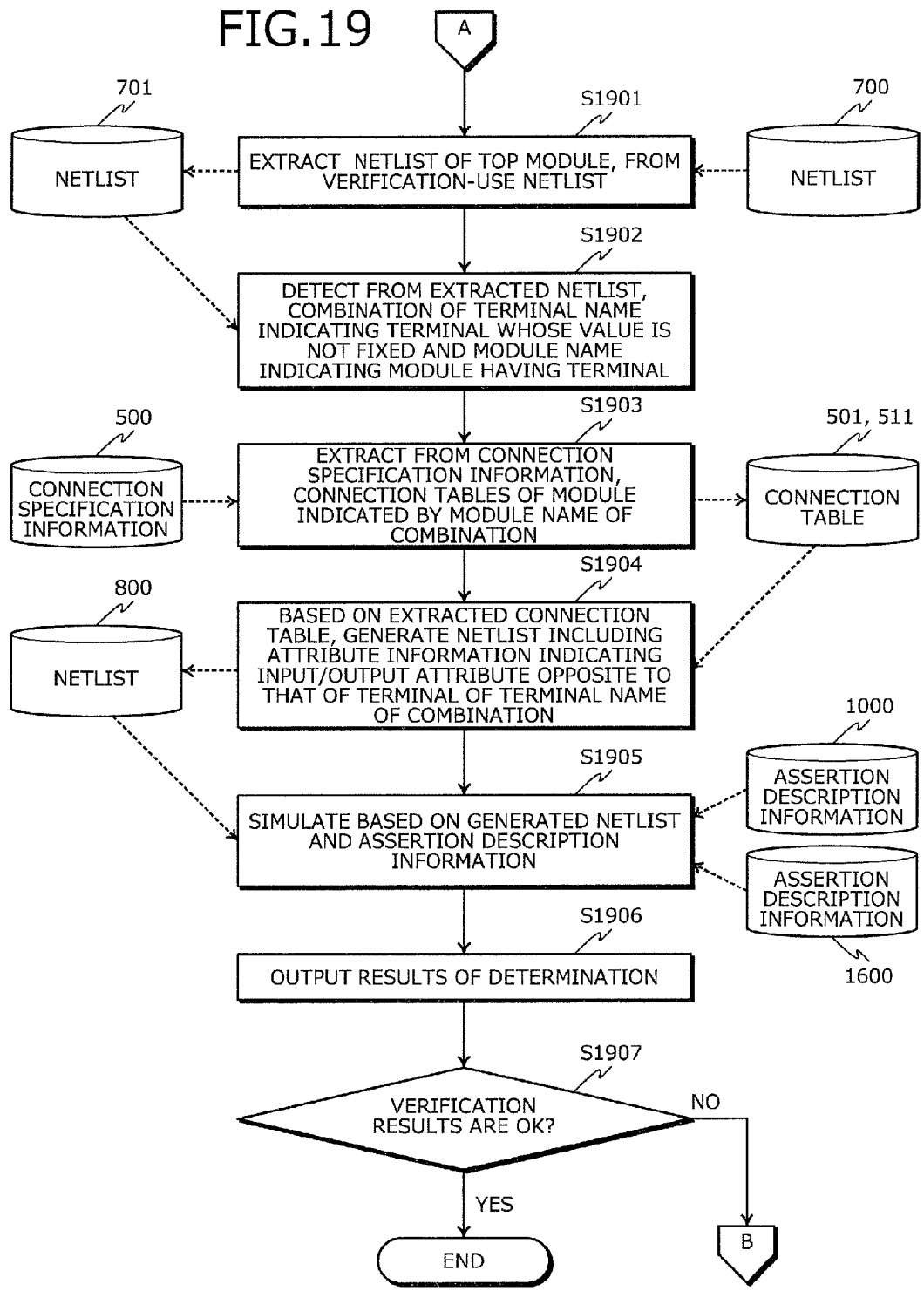

DETERMINING METHOD, COMPUTER PRODUCT, AND DETERMINING APPARATUS

CROSS REFERENCE TO RELATED APPLICATIONS

This application is based upon and claims the benefit of priority of the prior Japanese Patent Application No. 2013-189861, filed on Sep. 12, 2013, the entire contents of which are incorporated herein by reference.

FIELD

The embodiments discussed herein are related to a determining method, a computer product, and a determining apparatus.

BACKGROUND

Conventionally, there has been a technology of determining by a formal verification of whether a terminal indicated as being open in circuit information indicating a semiconductor integrated circuit is open in a design specification or open due to a design error (see, e.g., Japanese Laid-Open Patent Publication No. 2011-203962).

Further, there has been a technology of confirming that the state of an input terminal specified to have a fixed value does not enter a high-impedance state and, when not in the high-impedance state, determining by simulation whether the value of the input terminal becomes an anticipated value (see. e.g., Japanese Laid-Open Patent Publication No. 2009-48312).

Conventionally, in semiconductor integrated circuit testing, there has been a technology of sending a test signal to verify a connection part between open terminals and testing validity of an inter-macro connection by monitoring this test signal (see, e.g., Japanese Laid-Open Patent Publication No. H10-326301).

Nonetheless, there is a problem in that whether a specific terminal has become an open terminal in the circuit information cannot be determined by simulation and as a result, verification related to the terminal connection cannot be performed efficiently.

SUMMARY

According to an aspect of an embodiment, a determining method includes obtaining terminal information indicating a first object terminal that is among terminals included in a plurality of partial circuits and subject to determination of whether the first object terminal is an open terminal; obtaining for each of the terminals, connection information and first attribute information indicating an attribute of any one among an input terminal and an output terminal; generating, by a computer, for each of the terminals, second attribute information indicating an attribute opposite to the attribute indicated by the obtained first attribute information; and determining, by the computer, whether a state of the first object terminal indicated by the terminal information becomes a high-impedance state, by simulating based on the obtained connection information and the generated second attribute information, a state of each of the terminals when a value of a terminal that is among the terminals and indicated as being an output terminal by the second attribute information, is set at a first specified value.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 5 is an explanatory diagram of an example of connection specification information of a module Z;

FIG. 10 is an explanatory diagram of an assertion description information example;

FIG. 19 is a flowchart of an example of a procedure of determination processing by the determining apparatus according to Example 2.

DESCRIPTION OF EMBODIMENTS

Embodiments of a determining method, a computer product, and a determining apparatus will be described in detail with reference to the accompanying drawings.

Figure 1:
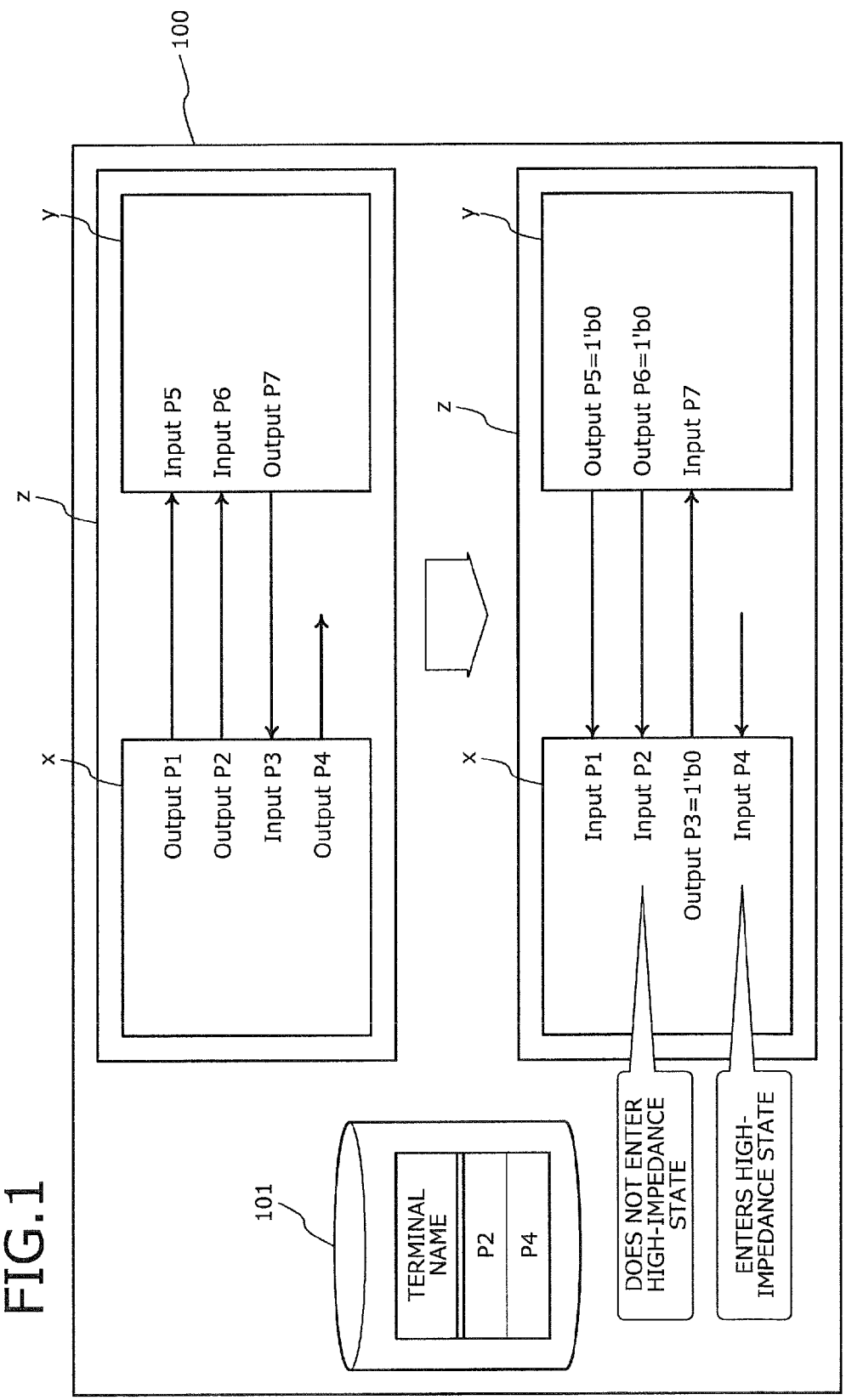
FIG. 1 is an explanatory diagram of an example of operation by a determining apparatus.

FIG. 1 is an explanatory diagram of an example of operation by the determining apparatus. A determining apparatus 100 is a computer that determines whether a terminal specified to be an open terminal in a design specification becomes the open terminal in a netlist designed based on the design specification. The determining apparatus 100 obtains terminal information 101 indicating among terminals included in plural partial circuits, terminals for which it is to be determined whether the terminal is an open terminal. A partial circuit is referred to as a module. The terminal information 101 is, for example, information indicating design specifications. In the example depicted in FIG. 1, P2 and P4 are the terminals for which the open terminal determination is to be made.

The determining apparatus 100 obtains for each of the terminals, connection information and first attribute information indicating an attribute of any one among an input terminal and an output terminal. For example, the connection information and the first attribute information are included in a netlist representing a module that includes plural modules. The netlist is described, for example, in a hardware description language such as Verilog and very high speed integrated circuit hardware description language (VHDL) or a system description language. The first attribute information may be information indicating a design specification. In an upper part of FIG. 1, a module z represented by a netlist is depicted for easier understanding. As depicted in FIG. 1, the module z includes a module x and a module y. The module x includes terminals P1 to P4 and the module y includes terminals P5 to P7. The attribute of either the input terminal or the output terminal is referred to as an input/output attribute. If the input/output attribute is for input, then the first attribute information is "Input". If the input/output attribute is for output, then the first attribute information is "Output". In the example depicted in FIG. 1, "Input" or "Output" prefixed to each terminal name is the first attribute information. For example, the input/output attribute of the terminals P1, P2, P4, and P7 is output and the input/output attribute of the terminals P3, P5, and P6 is input.

The determining apparatus 100 generates for each of the terminals, second attribute information that indicates the input/output attribute opposite to that indicated by the obtained first attribute information. As depicted in FIG. 1, with respect to each of the terminals, if the first attribute information is "Input", then the determining apparatus 100 generates the second attribute information with "Input" changed to "Output" and if the first attribute information is "Output", then the determining apparatus 100 generates the second attribute information with "Output" changed to "Input". Thus, as depicted in a lower part of FIG. 1, the determining apparatus 100 generates for each of the terminals, the second attribute information, which is an inversion of the input/output attribute. As a result, the determining apparatus 100 generates, for example, a netlist that includes the obtained connection information and the generated second attribute information. For example, the input/output attribute of the terminals P1, P2, P4, and P7 becomes input and the input/output attribute of the terminals P3, P5, and P6 becomes output.

Based on the obtained connection information and the generated second attribute information, the determining apparatus 100 simulates the state of each terminal when the value of a terminal that is among the terminals and indicated to be an output terminal by the second attribute information, is a specified value. The specified value is pre-determined by a designer and is stored in a storage device accessible to the determining apparatus 100. In the example depicted in FIG. 1, the specified value is "1'b0". Thus, the determining apparatus 100 determines whether the state of a given terminal indicated by the terminal information 101 becomes a high-impedance state. For example, the determining apparatus 100 performs simulation by providing to a simulator, assertion description information indicating a determination of whether the state of a given terminal becomes the high-impedance state and the netlist including the obtained connection information and the generated second attribute information. The assertion description information is, for example, information described in an assertion language.

For example, the determining apparatus 100 determines that a given terminal is open, if the state of the given terminal has become the high-impedance state. For example, the determining apparatus 100 determines that the given terminal is not open, if the state of the given terminal has not become the high-impedance state. For example, the value of the terminal P2 has become "1'b0" consequent to being connected to the terminal P6, and it is determined that the terminal P2 is not an open terminal. For example, the state of the terminal P4 has become the high-impedance state and it is determined that the terminal P4 is an open terminal.

Thus, it becomes possible to verify the validity of an open terminal, whereby efficient verification related to terminal connection can be achieved. Failures that can occur due to erroneous connection of terminals can be reduced and design quality can be enhanced.

Figure 2:
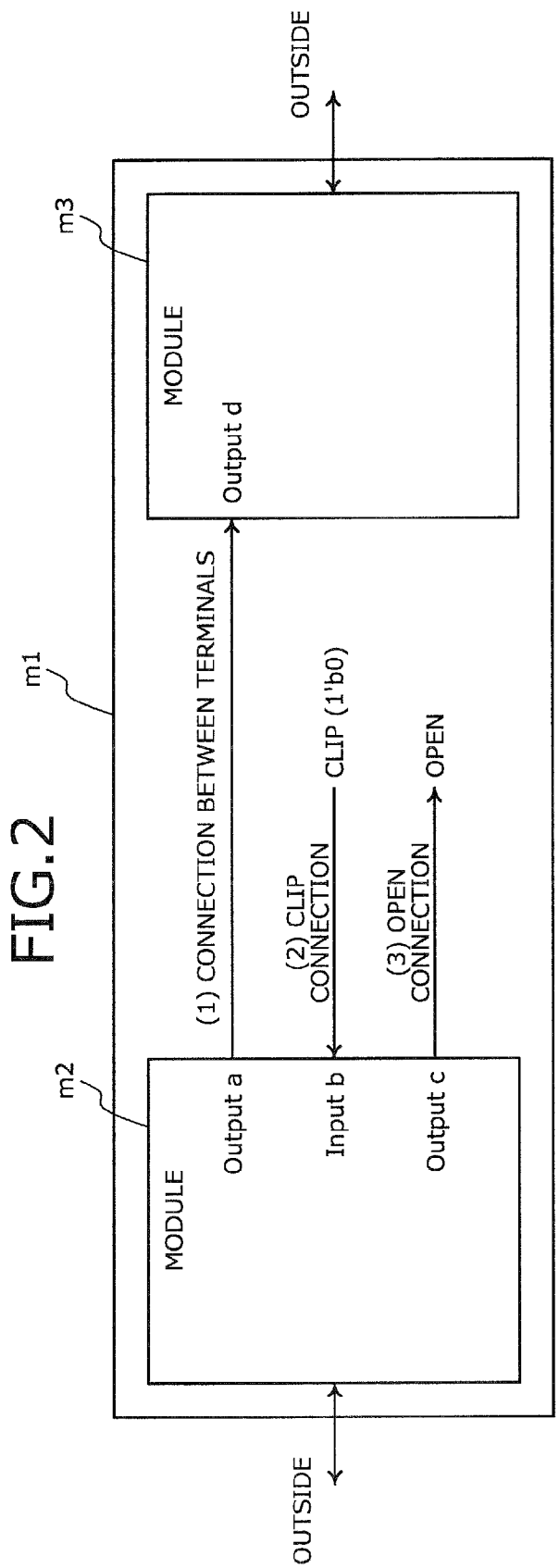
FIG. 2 is an explanatory diagram of a terminal connection example.

FIG. 2 is an explanatory diagram of a terminal connection example. For example, when a module m1 includes a module m2 and a module m3, the connection in the netlist is classified into three connections including a connection between the outside and the module m2, an inter-module connection between the module m2 and the module m3, and a connection between the module m3 and the outside.

The terminal connection in the inter-module connection includes three types of connections including, for example, (1) an inter-terminal connection in which the input terminal and the output terminal are connected, (2) a clip connection in which the value of the input terminal is fixed, and (3) an open connection in which the output terminal having no connection destination. With respect to (2) the clip connection, in the example depicted in FIG. 2, although the value of the input terminal is fixed at "1'b0", the value of the input terminal can also be fixed at "1'b1". With respect to the open connection, as described above, in this embodiment, whether the output terminal is an open terminal is determined by simulation.

For example, with respect to the clip connection, whether the value of the input terminal is fixed in the netlist is verified by simulating the value of the input terminal to determine whether the value is a fixed value. For example, with respect to the inter-terminal connection, whether the output terminal and the input terminal are connected in the netlist is verified by simulating the value of the output terminal and the value of the input terminal to determine whether the value of the output terminal and the value of the input terminal match. For example, a description in an assertion language to verify the inter-terminal connection between a terminal a and a terminal d is as follows.

"Assert Always (module m2. A===module m3. d)"

Figure 3:
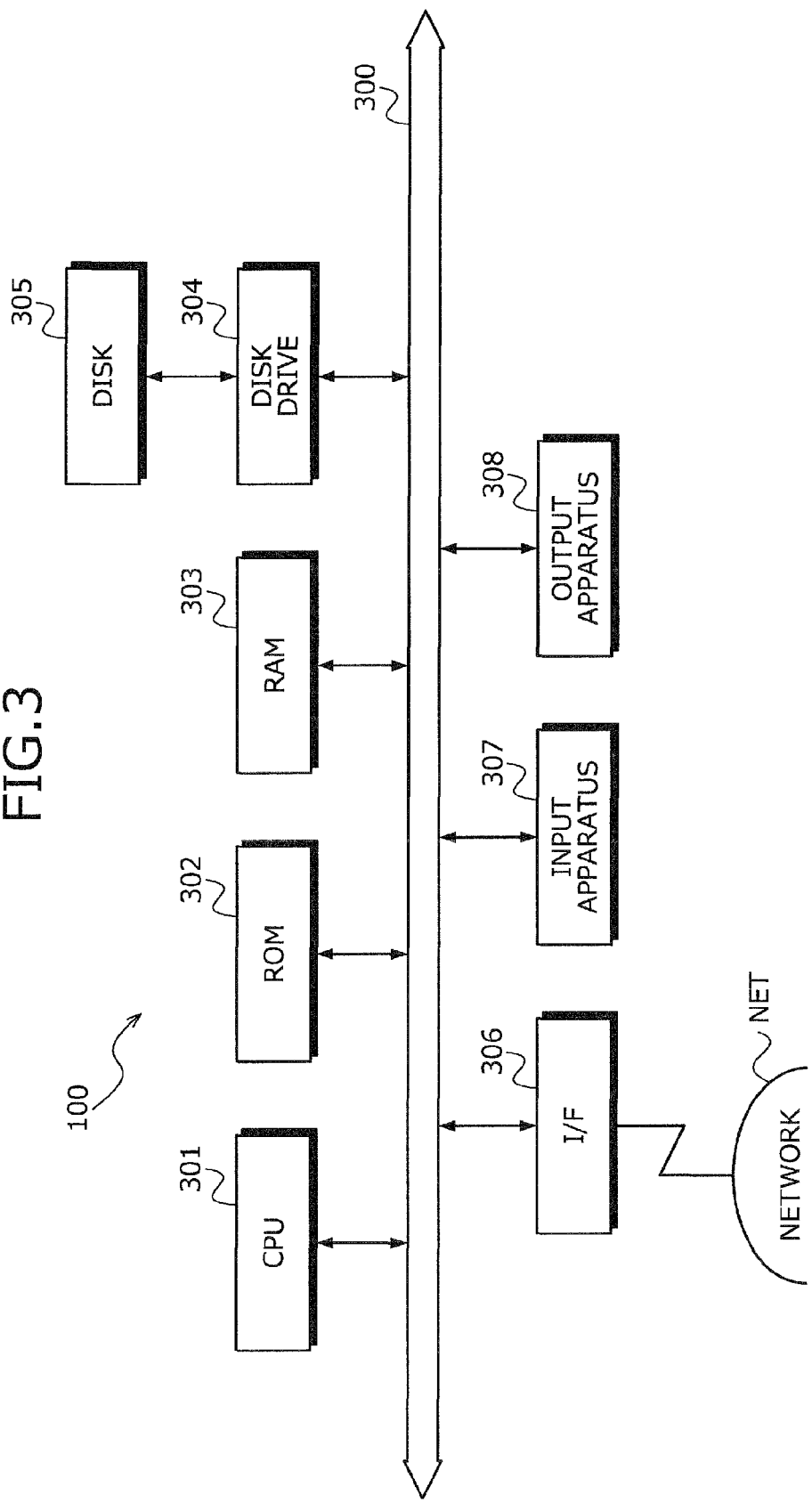
FIG. 3 is a block diagram of an example of a hardware configuration of the determining apparatus.

FIG. 3 is a block diagram of an example of a hardware configuration of the determining apparatus according to the embodiments. the determining apparatus 100 includes a central processing unit (CPU) 301, read-only memory (ROM) 302, random access memory (RAM) 303, a disk drive 304, a disk 305, an interface (I/F) 306, an input apparatus 307, and an output apparatus 308, respectively connected by a bus 300.

The CPU 301 performs overall control and data processing of the determining apparatus 100 by, for example, loading onto the RAM 303 and executing a program stored in the ROM 302. The ROM 302 stores programs such as a boot program and a determining program. The RAM 303 is a storage device that is used as a work area of the CPU 301. The disk drive 304, under the control of the CPU 301, controls the reading and writing of data with respect to the disk 305. The disk 305 stores data written thereto under the control of the disk drive 304. A magnetic disk, an optical disk, and the like may be used as the disk 305.

The I/F 306 is connected, via a communication, to a network NET such as a local area network, a wide area network, and the Internet, and is connected to other apparatuses through the network NET. The I/F 306 administers an internal interface with the network NET, and controls the input and output of data with respect to external apparatuses. A modem and LAN adapter may be used as the I/F 306, for example.

The input apparatus 307 is an interface that inputs various types of data consequent to the designer manipulating a keyboard, mouse, touch panel, etc. Further, the input apparatus 307 can take in images and video from a camera as well as sound from a microphone. The output apparatus 308 is an interface that output data consequent to an instruction by the CPU 301. A display and a printer may be used as the output apparatus 308.

Figure 4:
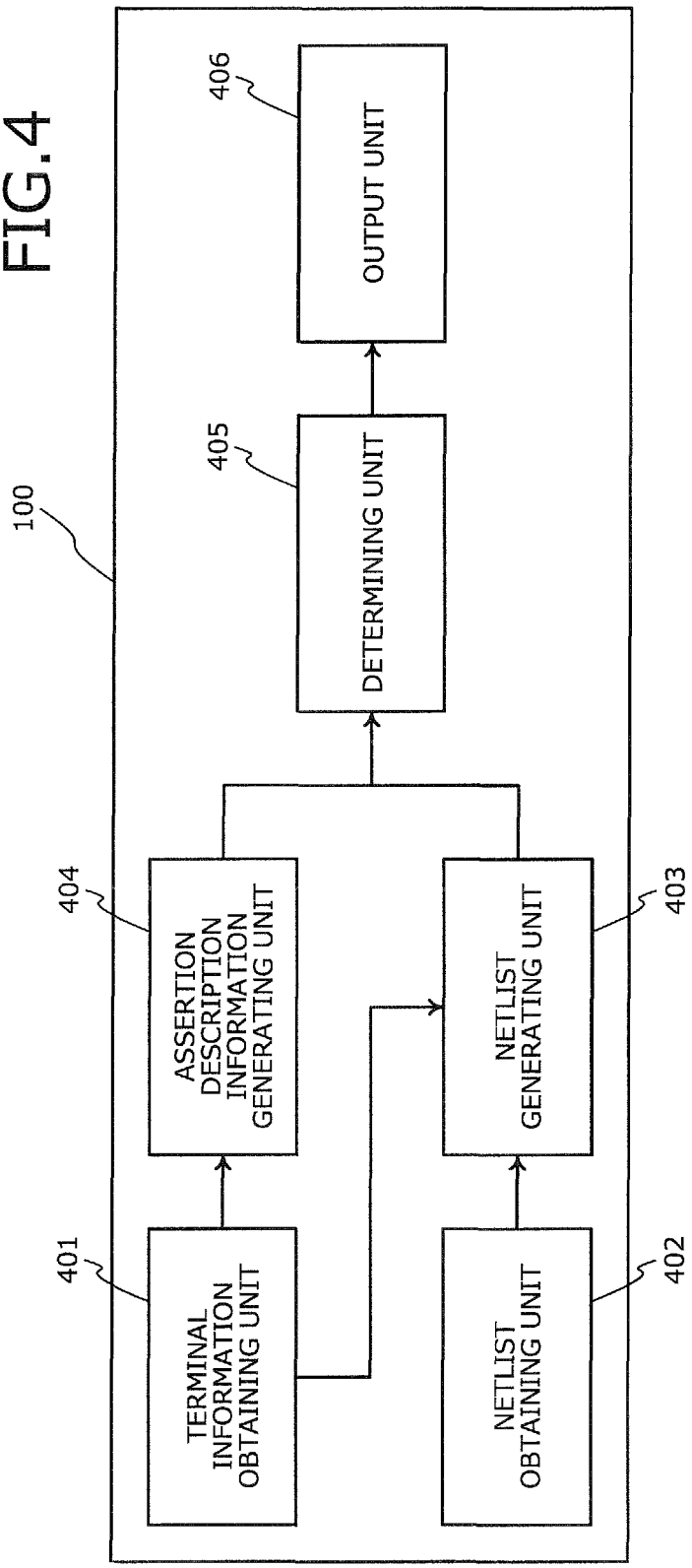
FIG. 4 is a block diagram of a functional configuration of the determining apparatus.

FIG. 4 is a block diagram of a functional configuration of the determining apparatus. The determining apparatus 100 has a terminal information obtaining unit 401, a netlist obtaining unit 402, a netlist generating unit 403, an assertion description information generating unit 404, a determining unit 405, and an output unit 406. Processing of the terminal information obtaining unit 401 to the output unit 406 is coded into the determining program stored in a storage device such as the disk 305 accessible to the CPU 301. The CPU 301 reads out the determining program stored in the storage device and executes the processing coded into the determining program, thereby implementing the processing of the terminal information obtaining unit 401 to the determining unit 405. Results of the processing by each unit are stored to a storage device such as, for example, the RAM 303 and the disk 305.

The terminal information obtaining unit 401 obtains terminal information indicating a first object terminal among the terminals included in plural partial circuits and for which the open terminal determination is to be performed. The terminal information obtaining unit 401 obtains terminal information indicating a second object terminal among the terminals. The second object terminal is subject to the determination of whether the terminal is a terminal of the clip connection described above. The terminal information obtaining unit 401 obtains terminal information indicating a third object terminal among the terminals. The third object terminal is subject to the determination of whether the terminal is a terminal of the inter-terminal connection. As for a specific obtaining method, for example, the terminal information may be obtained from a storage device such as the disk, input by way of the input apparatus, or obtained from another apparatus by way of a network. An example will be described in which a given circuit to be verified is a module Z and the partial circuits included in the module Z are a module X and a module Y. For example, the terminal information obtaining unit 401 obtains a connection table for each module included in connection specification information.

FIG. 5 is an explanatory diagram of an example of connection specification information of the module Z. Module Z connection specification information 500 includes a module X connection table 501 and a module Y connection table 511. The module X connection table 501 indicates the connection specification of each terminal of the module within the module. The module Y connection table 511 indicates the connection specification of each terminal of the module within the module.

The module X connection table 501 includes, for example, fields of "PortName", "Bit", "I/O", "Connection", and "Note". Information set into the fields of the module X connection table 501 is stored as records (502-1 to 502-3). The module X connection table 501 is stored in a storage device such as the RAM 303 and the disk 305.

In the PortName field, a terminal name is set as identification information identifying a terminal of the module X. In the Bit field, a bit width of the terminal is set. In the I/O field, attribute information is set that indicates the input/output attribute information of whether the terminal is an input terminal or an output terminal. If the terminal is an output terminal, then "Out" is set and if the terminal is an input terminal, then "In" is set. In the Connection field, connection-related information is set such as a connection destination, a fixed value, and "OPEN". In the case of connection to an input terminal or an output terminal, identification information of the connection destination is set. In the case of an input terminal with the input value clipped, the value at which to clip is set as a fixed value. In the case of an open terminal, "OPEN" is set. In the Note field, a note by the designer is set with respect to the terminals.

According to the module X connection table 501, terminal Port_A is an output terminal and is connected to terminal Port_D of the module Y. According to the module X connection table 501, terminal Port_B is an input terminal and is fixed at "1'b1". According to the module X connection table 501, terminal Port_C is an output terminal and is an open terminal.

Since the fields of the module Y connection table 511 are the same as those of the module X connection table 501, detailed description of each field is omitted. Information set in the fields of the module Y connection table 511 is stored as records (512-1 and 512-2). The module Y connection table 511 is stored in the storage device such as the RAM 303 and the disk 305.

According to the module Y connection table 511, terminal Port_D is an input terminal and is connected to terminal Port_A of the module X. According to the module Y connection table 511, terminal Port_E is an input terminal and is fixed at "1'b0".

For example, the terminal information obtaining unit 401 extracts from the connection table of each module included in the connection specification information 500, the record having "OPEN" set in the Connection field, as the terminal information indicating the first object terminal subject to the open terminal determination. For example, record 502-3 is extracted as the terminal information indicating the first object terminal. For example, the terminal information obtaining unit 401 extracts from the connection table of each module, the record having a fixed value set in the Connection field, as the terminal information indicating the second object terminal. For example, records 502-2 and 512-2 are extracted as the terminal information indicating the second object terminal. For example, the terminal information obtaining unit 401 extracts from the connection table of each module, the record having the terminal name of the connection destination set in the Connection field, as the terminal information indicating the third object terminal. For example, records 502-1 and 512-1 are extracted as the terminal information indicating the third object terminal.

Processing of the netlist obtaining unit 402 to the output unit 406 will be described in detail, using Example 1 and Example 2. This embodiment determines whether the terminal Port_C of the module X is an open terminal in the netlist representing the assembled module Z. Example 1 below represent determination example 1 in which the terminal Port_C of the module X is determined to be an open terminal and determination example 2 in which the terminal Port_C of the module X is determined to not be an open terminal. Example 2 represents an example of a method of preparing a simulation-use netlist different from Example 1.

Example 1

Determination Example 1

Figure 6:
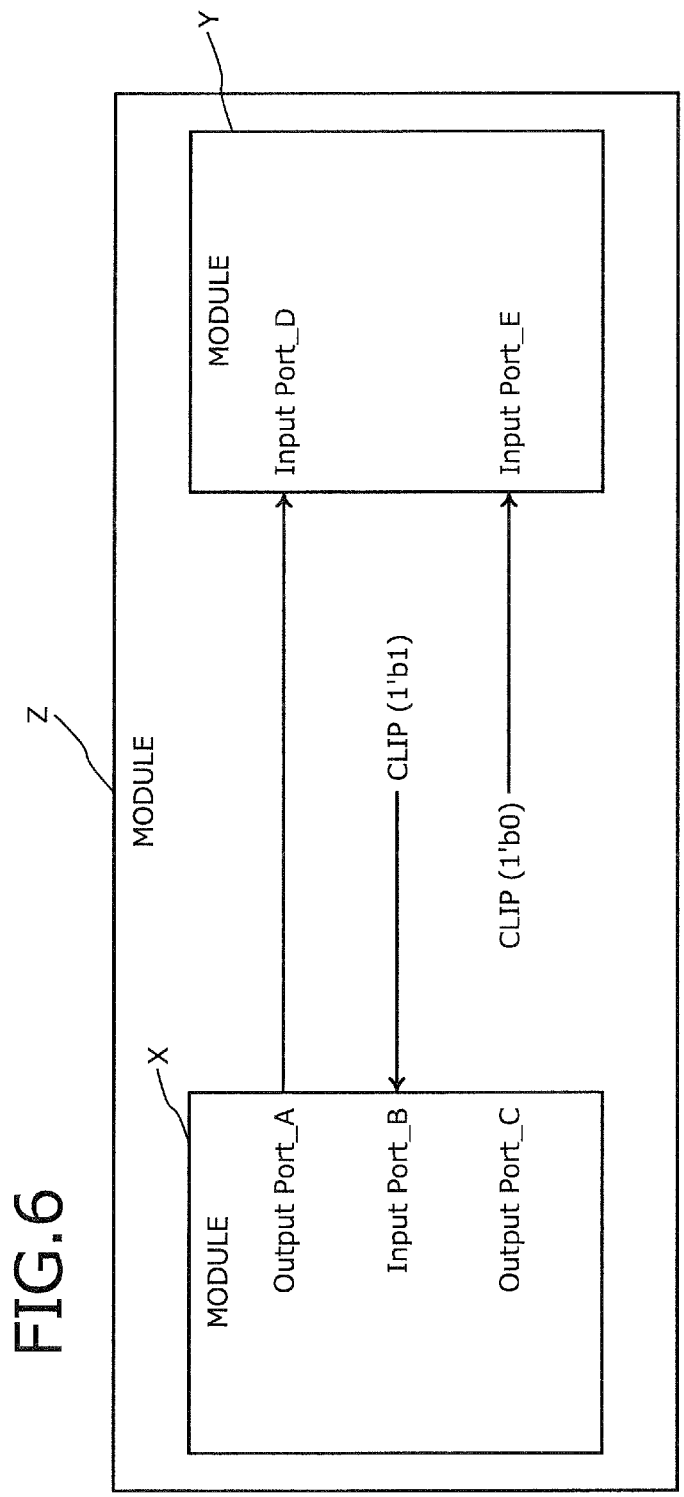
FIG. 6 is an explanatory diagram of a connection relationship between modules represented by a netlist according to determination example 1.

FIG. 6 is an explanatory diagram of a connection relationship between the modules represented by the netlist according to determination example 1. In determination example 1, an example is depicted in which it is determined that, as the first object terminal subject to the open terminal determination, the terminal Port_C is an open terminal in the netlist.

The netlist obtaining unit 402 obtains for each of the terminals, the connection information and the first attribute information indicating the attribute of either input terminal or output terminal. For example, the netlist obtaining unit 402 obtains a netlist that represents plural modules and that includes the connection information and the first attribute information. The netlist obtained here is described in a hardware description language such as Verilog and VHDL and the system description language.

Figure 7:
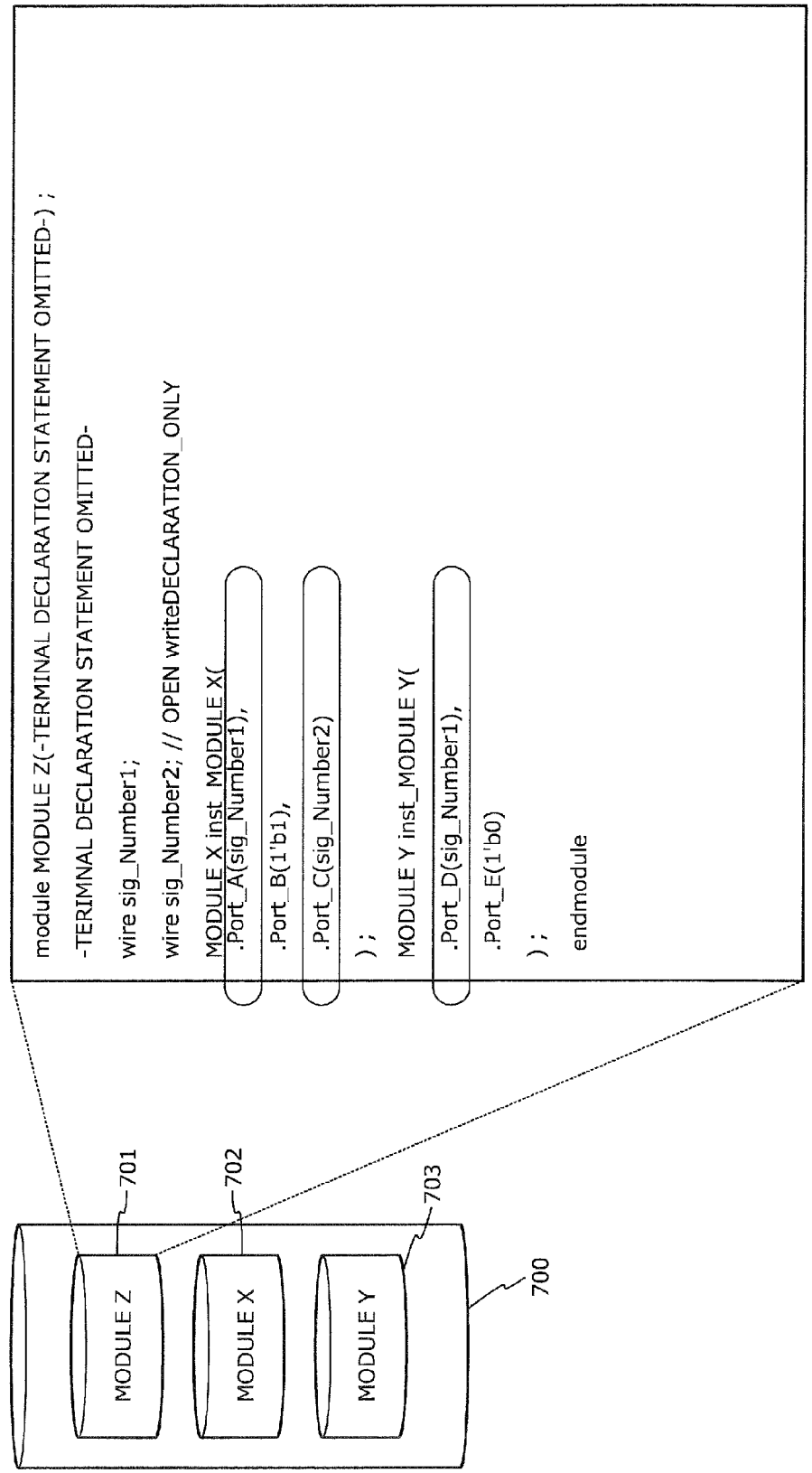
FIG. 7 is an explanatory diagram of a netlist of the module Z according to determination example 1.

FIG. 7 is an explanatory diagram of the netlist of the module Z according to determination example 1. A netlist 700 to be obtained includes a netlist 701 of the module Z, a netlist 702 of the module X, and a netlist 703 of the module Y. The netlist 701 is a definition statement of the module Z described in Verilog HDL and is circuit information representing the module Z. In the netlist 701, a terminal declaration statement of the module Z is omitted. For example, the netlist 701 describes instance syntax instantiating the module X and the module Y, respectively. Since the connection of the terminals of each module is described in respective instance syntax, the netlist 701 is connection information indicating terminal connections of each module.

A module name indicating the module X, a terminal name indicating the terminal of the module X, and a net name indicating a signal line to be connected to each terminal are described in the instance syntax of the module X. According to the instance syntax of the module X, terminal Port_A of the module X is connected to signal line sig_Number1. According to the instance syntax of the module X, the value of terminal Port_B of the module X is fixed at "1'b1". According to the instance syntax of the module X, terminal Port_C of the module X is connected to signal line sig_Number2.

The terminal of the module Y and the net name indicating the signal connected to the terminal of the module Y are described in the instance syntax of the module Y. According to the instance syntax of the module Y, terminal Port_D of the module Y is connected to signal line sig_Number1. According to the instance syntax of the module Y, the value of terminal Port_E of the module Y is fixed at "1'b0".

The netlist generating unit 403 generates for each of the terminals, the second attribute information indicating the attribute opposite to that indicated by the obtained first attribute information. Based on the obtained connection information, the netlist generating unit 403 refrains from generating the second attribute information with respect to a terminal among the terminals and whose value is a fixed value. The netlist generating unit 403 generates output information setting, at a specified value, the value of a terminal among the terminals and indicated to be an output terminal by the second attribute information. The specified value is, for example, a logical value of 1 or 0. The specified value is pre-determined by the designer and is stored in a storage device such as the RAM 303 and the disk 305. For example, the second attribute information and the output information are definition statements in which the modules are defined and are netlists representing the modules.

For example, the netlist generating unit 403 detects from the netlist 701, a combination of the module name of the instance syntax described in the netlist 701 and the terminal name having the description of the connection destination or the terminal name having the description of neither the connection destination nor the fixed value. The combination is detected of the circled terminal name shown in FIG. 7 and the module name of the instance syntax in which such terminal name is described. A terminal among the terminals other than a first terminal and indicated by any one among a terminal name having the connection destination described correlated thereto and a terminal name having neither the connection destination nor the fixed value described and correlated thereto is a second terminal. The first terminal is a terminal indicated by a terminal name having a fixed value described and correlated thereto.

With respect to each of the detected combinations, the netlist generating unit 403 searches the netlist 701, for the definition statement of the module, based on the module name of the combination. The netlist generating unit 403 converts the input/output attribute described in the terminal declaration statement included in the definition statement of the detected module, based on the terminal name of the combination so that the input/output attribute will be inverted. For example, the netlist generating unit 403 converts "Output" to "Input" and "Input" to "Output".

Figure 8:
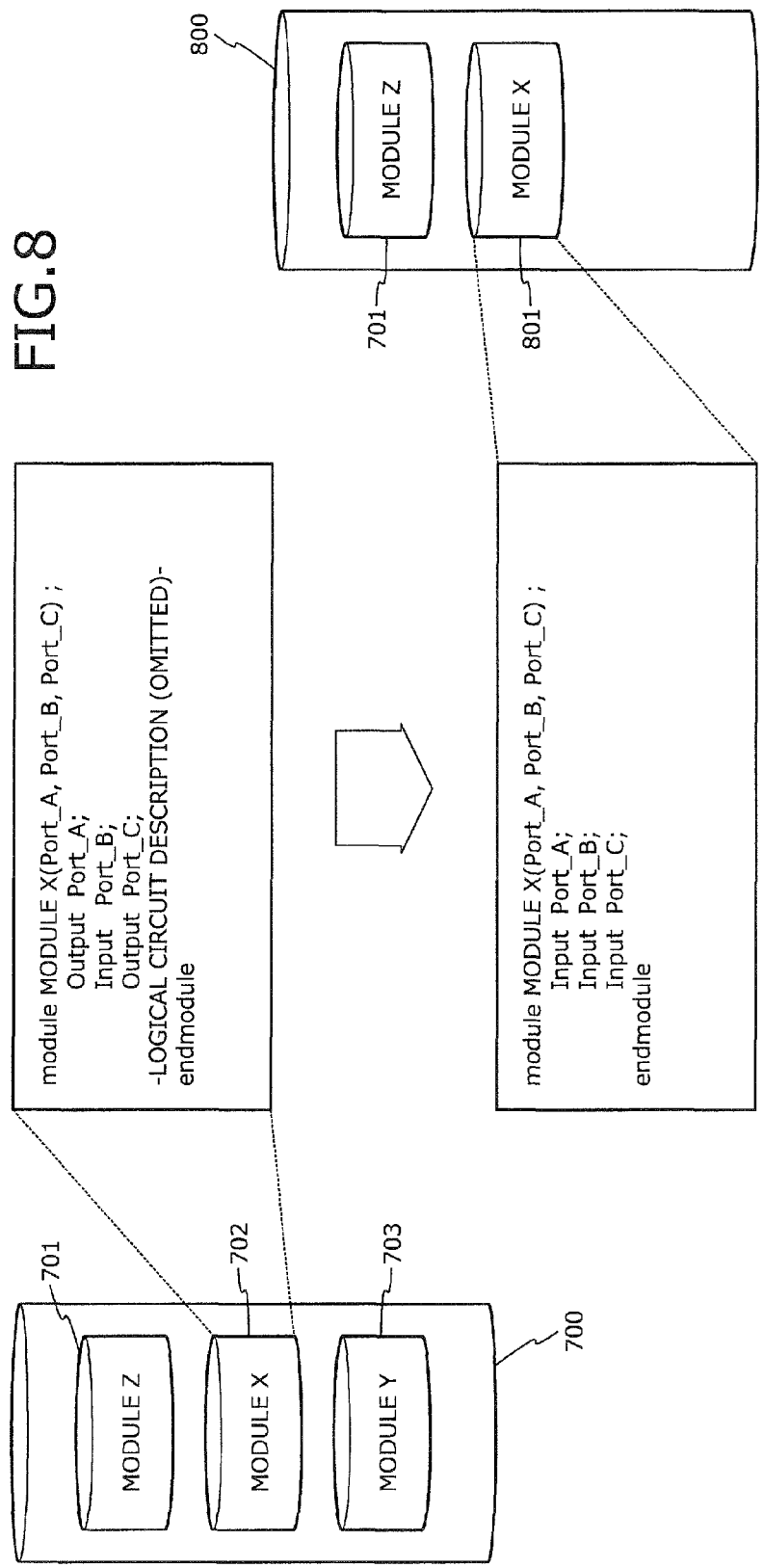
FIG. 8 is an explanatory diagram of a netlist example of a module X before and after conversion according to determination example 1.

FIG. 8 is an explanatory diagram of a netlist example of the module X before and after the conversion according to determination example 1. The netlist 702 is the definition statement of the module X described in Verilog HDL and is the circuit information representing the module X. In the netlist 702, detailed logic circuit description is omitted. The netlist generating unit 403 converts, for example, the input/output attribute information of the terminal declaration statement of terminal Port_A described in the netlist 702 from "Output" to "Input". The netlist generating unit 403 converts, for example, the input/output attribute information of the terminal declaration statement of terminal Port_C described in the netlist 702 from "Output" to "Input". Thus, the netlist generating unit 403 generates a netlist 800 having the netlist 701 and a netlist 801 in which the input/output attribute information is converted.

Figure 9:
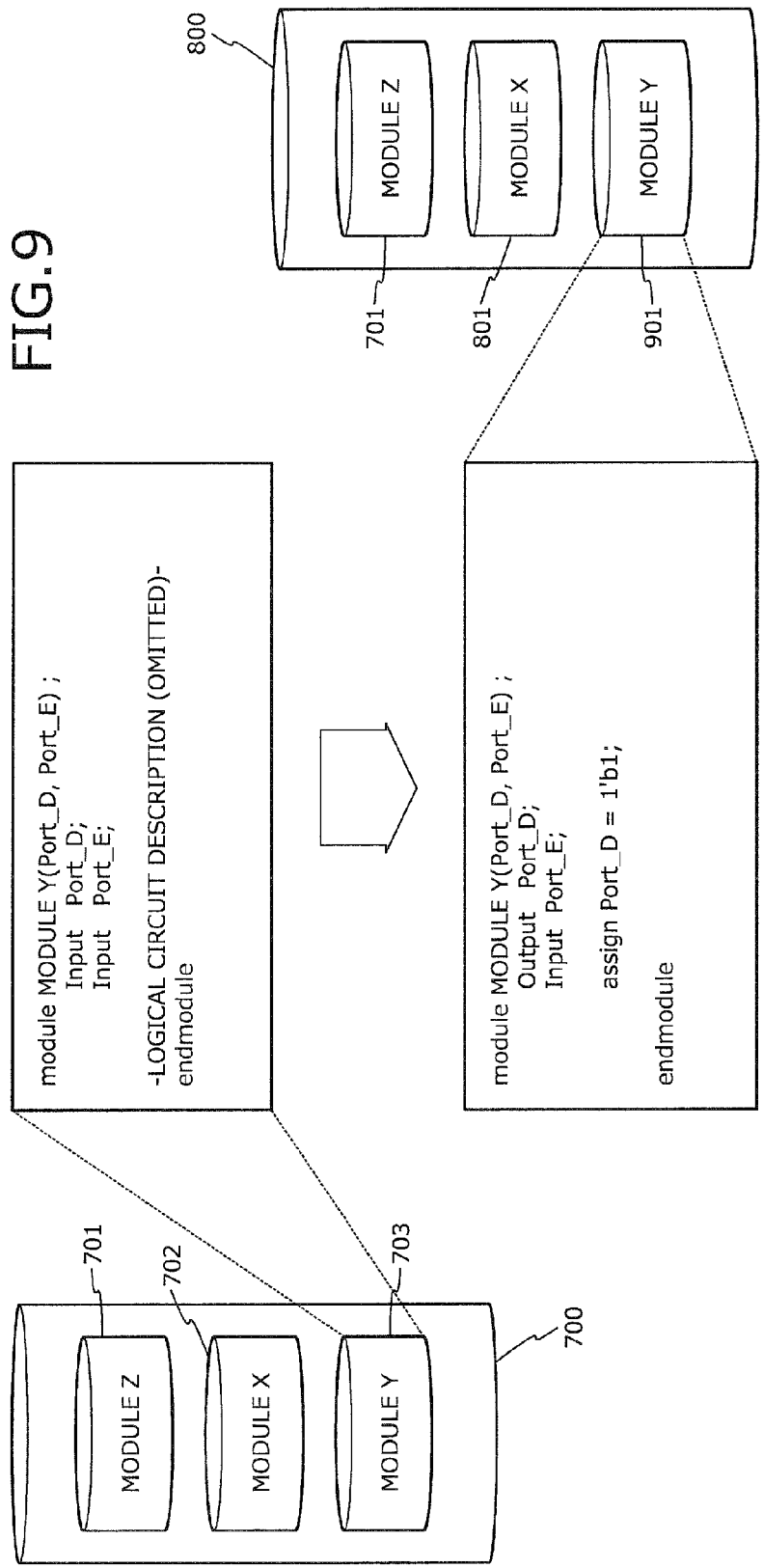
FIG. 9 is an explanatory diagram of a netlist example of a module Y before and after the conversion according to determination example 1.

FIG. 9 is an explanatory diagram of a netlist example of the module Y before and after the conversion according to determination example 1. The netlist 703 is the definition statement of the module Y described in Verilog HDL and is the circuit information representing the module Y. In the netlist 703, detailed logic circuit description is omitted. The netlist generating unit 403 converts, for example, the input/output attribute information of the terminal declaration statement of terminal Port_D described in the netlist 703 from "Input" to "Output".

To set the output value of the terminal whose input/output attribute is the output to a specified value in the simulation, the netlist generating unit 403 adds output information indicative of setting of the value of the terminal whose input/output attribute information has been changed from "Input" to "Output" to the specified value. The specified value is pre-determined by the designer and is stored in a storage device such as the RAM 303 and the disk 305. In the example of FIG. 9, the output information is "assign" definition statement and the value of terminal Port_D is fixed at "1'b1". Thus, the netlist generating unit 403 generates the netlist 800 including the netlist 701, the netlist 801, and a netlist 901. The generated netlist 800 is stored to a storage device such as the RAM 303 and the disk 305.

The assertion description information generating unit 404 generates assertion description information indicating determination of whether the state of the first object terminal indicated by the obtained terminal information is the high-impedance state. The assertion description information is the information described in the assertion language that describes the design specification.

FIG. 10 is an explanatory diagram of an assertion description information example. For example, the assertion description information generating unit 404 identifies the module name indicated by the connection table 501 that includes record 502-3 obtained as the terminal information indicating the first object terminal and further identifies the terminal name set in the PortName field included in record 502-3. The assertion description information generating unit 404 generates "moduleX.Port_C" (left-hand part), based on the identified module name and the identified terminal name.

The assertion description information generating unit 404 then generates "1'bz" (right-hand part) indicating the high-impedance state, based on the bit width set in the Bit field included in record 502-3. Thus, the assertion description information generating unit 404 generates assertion description information 1000 in which the generated right-hand part and the generated left-hand part are combined. According to the assertion description information 1000, if the state of terminal Port_C is not the high-impedance state, then an error is output. The generated assertion description information 1000 is stored to a storage device such as the RAM 303 and the disk 305.

The assertion description information generating unit 404 generates the assertion description information indicating determination of whether the value of the second object terminal indicated by the terminal information is a second specified value. The second specified value is included in the connection specification information 500. For example, the second specified value with respect to the terminal Port_B is "1'b1" set in the Connection field included in record 502-2. For example, the second specified value with respect to terminal Port_E is "1'b0" set in the Connection field included in record 512-2.

Based on the obtained connection information and the generated second attribute information, the determining unit 405 simulates, among the terminals, the state of each terminal indicated as an output terminal by the second attribute information and whose value is set at a specified value. Thus, the determining unit 405 determines whether the state of the first object terminal indicated by the terminal information is the high-impedance state. For example, the determining unit 405 outputs an error if the state of the first object terminal does not become the high-impedance state by simulating the state of each terminal based on the netlist 800 and the assertion description information 1000.

The determining unit 405 simulates the state of each terminal, based on the connection information obtained for each of the terminals, the first attribute information obtained for each of the first terminals, and the second attribute information generated for each of the second terminals. Thus, the determining unit 405 further determines whether the value of the second object terminal is a second specified value.

The output unit 406 outputs results of the determination by the determining unit 405. For example, if the state of the first object terminal is the high-impedance state, the output unit 406 outputs indication that the first object terminal is an open terminal and if the state of the first object terminal is not the high-impedance state, the output unit 406 outputs indication that the first object terminal is not an open terminal.

Figure 11:
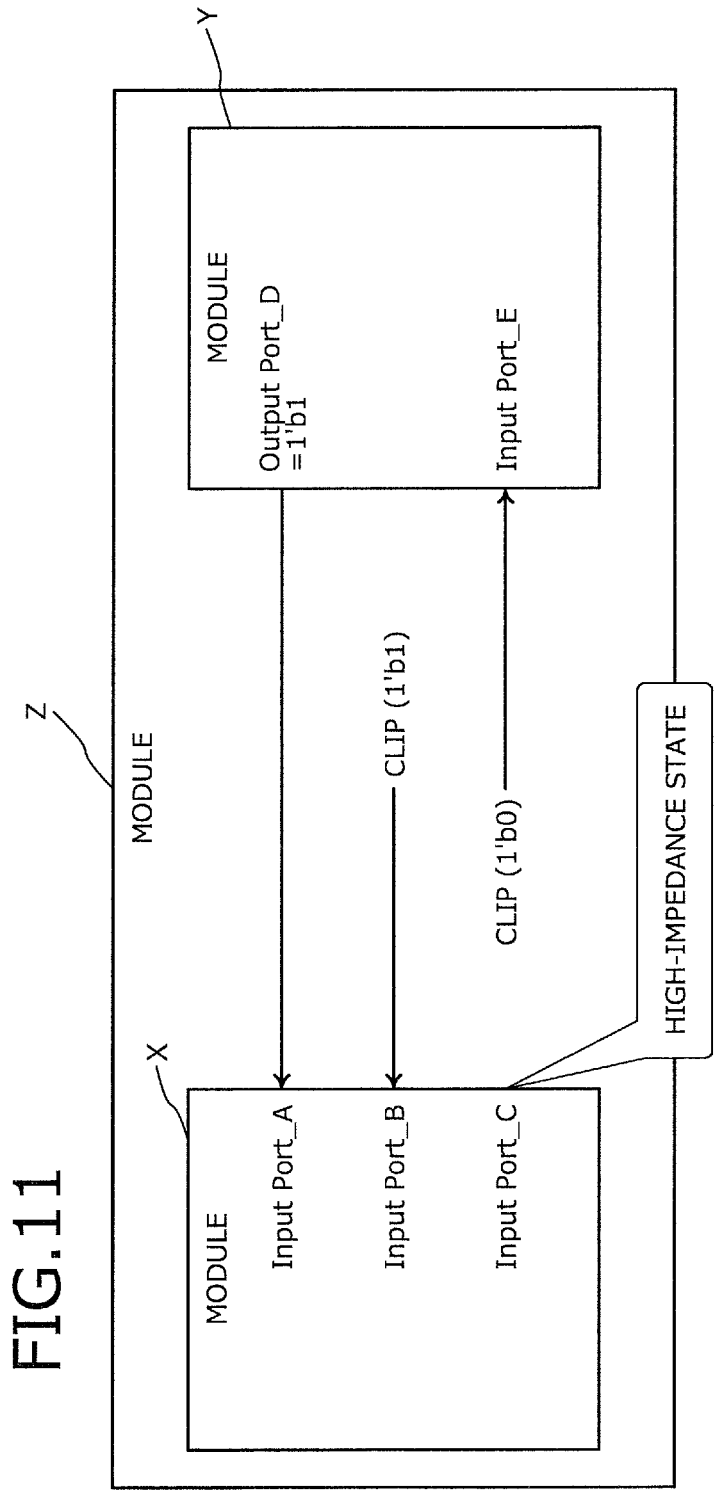
FIG. 11 is an explanatory diagram of results of a determination in determination example 1.

FIG. 11 is an explanatory diagram of the results of the determination in determination example 1. The state of terminal Port_C as the first object terminal becomes the high-impedance state and terminal Port_C is determined to be an open terminal. The value of terminal Port_B as the second object terminal becomes "1'b1" and terminal Port_B is determined to be a terminal of a clip connection. The value of terminal Port_E as the second object terminal becomes "1'b0" and terminal Port_E is determined to be a terminal of a clip connection. Since the value of terminal Port_A as the third object terminal and the value of terminal Port_D as the third object terminal match, it is determined that the terminal Port_A and terminal Port_D are the terminals of an inter-terminal connection.

Determination Example 2

Figure 12:
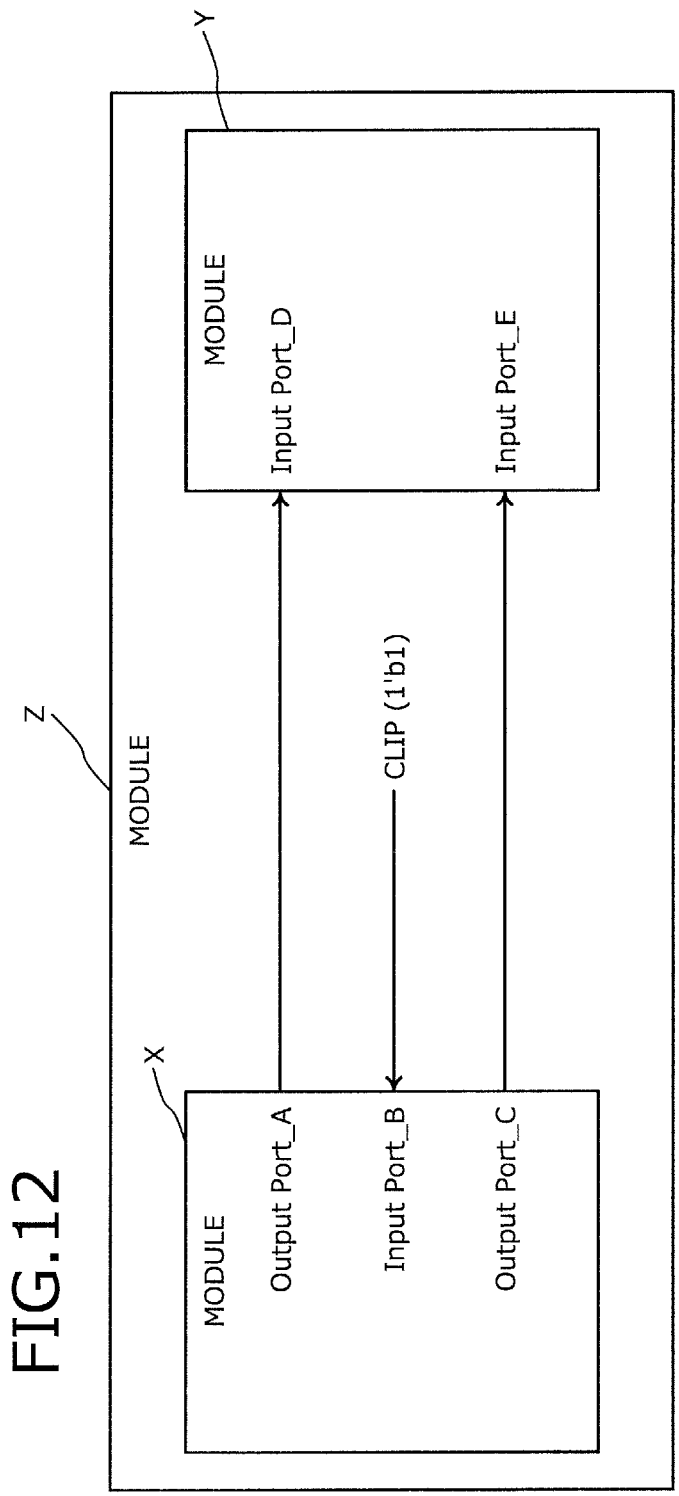
FIG. 12 is an explanatory diagram of a connection relationship between modules indicated by the netlist according to determination example 2.

FIG. 12 is an explanatory diagram of a connection relationship between the modules indicated by the netlist according to determination example 2. In determination example 2, an example is depicted in which it is determined that terminal Port_C, as the first object terminal for which the open terminal determination is to be performed, does not become an open terminal in the netlist. As depicted in FIG. 12, terminal Port_C is erroneously connected to terminal Port_E. The processing by each unit is the same as in determination example 1.

Figure 13:
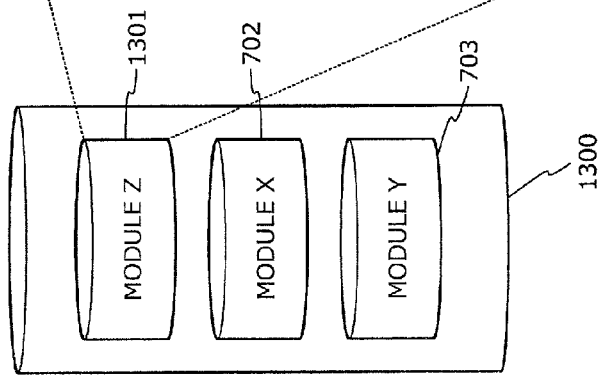
FIG. 13 is an explanatory diagram of the netlist of the module Z according to determination example 2.

FIG. 13 is an explanatory diagram of the netlist of the module Z according to determination example 2. A netlist 1300 is described in the same manner as in the netlist 700 according to determination example 1. According to the instance syntax of the module X, terminal Port_A of the module X is connected to signal line sig_Number1. According to the instance syntax of the module X, the value of terminal Port_B of the module X is fixed at "1'b1". According to the instance syntax of the module X, terminal Port_C of the module X is connected to signal line sig_Number2.

According to the instance syntax of the module Y, terminal Port_D of the module Y is connected to signal line sig_Number1. According to the instance syntax of the module Y, terminal Port_E of the module Y is connected to signal line sig_Number2.

As described in determination example 1, the netlist generating unit 403 generates a netlist obtained by inverting the input/output attribute of the second terminals other than the first terminals whose value is the fixed value, out of the terminals. Since the netlist of the module X with the input/output attribute inverted is the same netlist 801 as in determination example 1, detailed description thereof is omitted.

Figure 14:
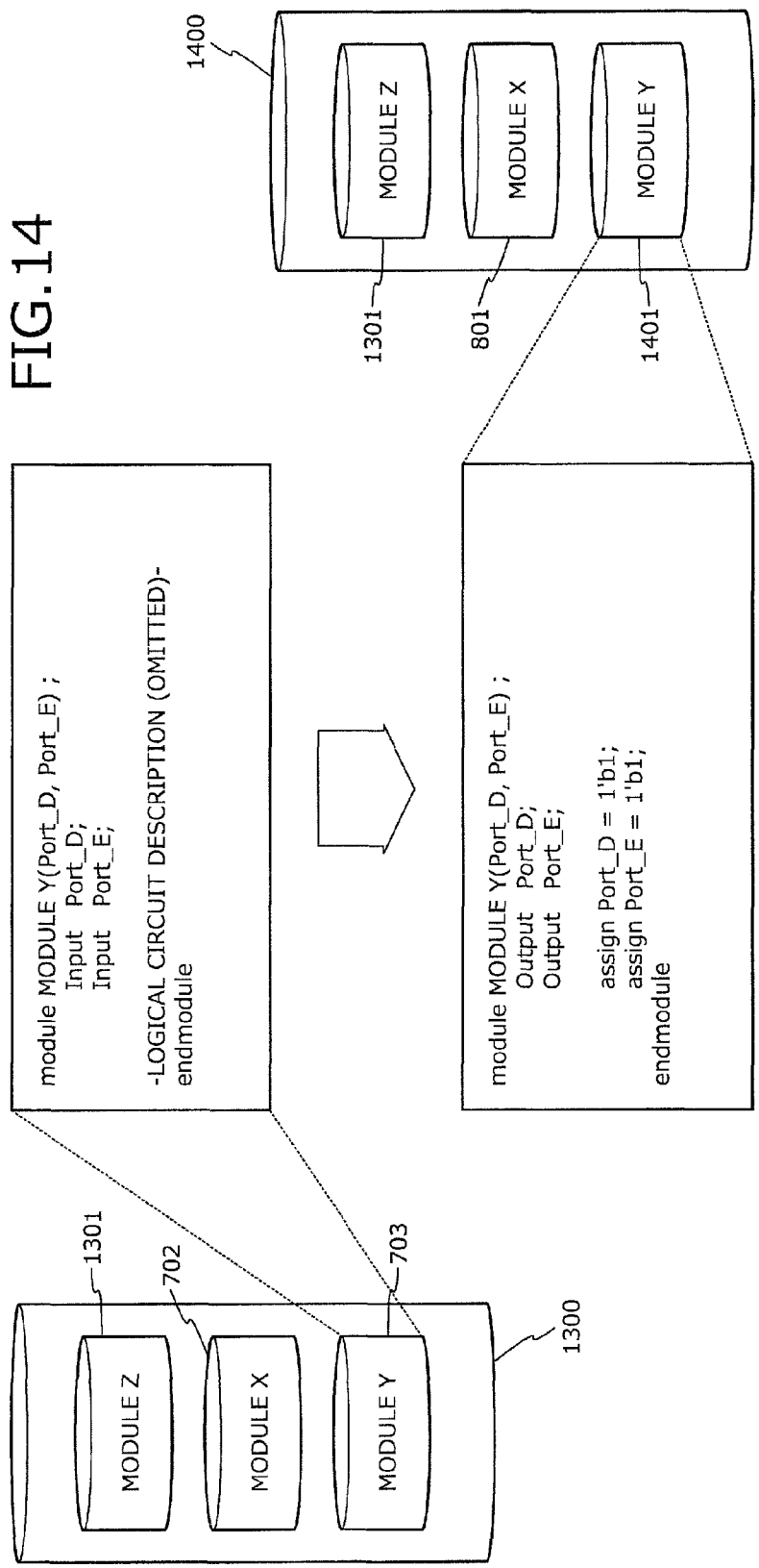
FIG. 14 is an explanatory diagram of a netlist example of the module Y before and after the conversion according to determination example 2.

FIG. 14 is an explanatory diagram of a netlist example of the module Y before and after the conversion according to determination example 2. The netlist generating unit 403 converts, for example, the input/output attribute information of the terminal declaration statement of terminal Port_D described in the netlist 703, from "Input" to "Output". The netlist generating unit 403 converts, for example, the input/output attribute information of the terminal declaration statement of terminal Port_E described in the netlist 703, from "Input" to "Output".

The netlist generating unit 403 adds the output information indicating that the value of a terminal whose input/output attribute information has been changed from "Input" to "Output" has been set to a specified value. The output information is "assign" definition statement to fix the value of each terminal. In the example depicted in FIG. 14, the value of each of terminal Port_D and terminal Port_E is fixed at "1'b1". Thus, the netlist generating unit 403 generates a netlist 1400 that includes a netlist 1301, the netlist 801 with the input/output attribute inverted, and a netlist 1401 with the input and output attribute inverted. The netlist 1400 is stored to a storage device such as the RAM 303 and the disk 305.

The determining unit 405 simulates the state of each terminal, based on the netlist 1400 and the assertion description information 1000. Since the assertion description information 1000 is the same as in determination example 1, detailed description thereof is omitted. If the state of terminal Port_C does not become the high-impedance state, then the output unit 406 outputs indication that terminal Port_C is not an open terminal.

Figure 15:
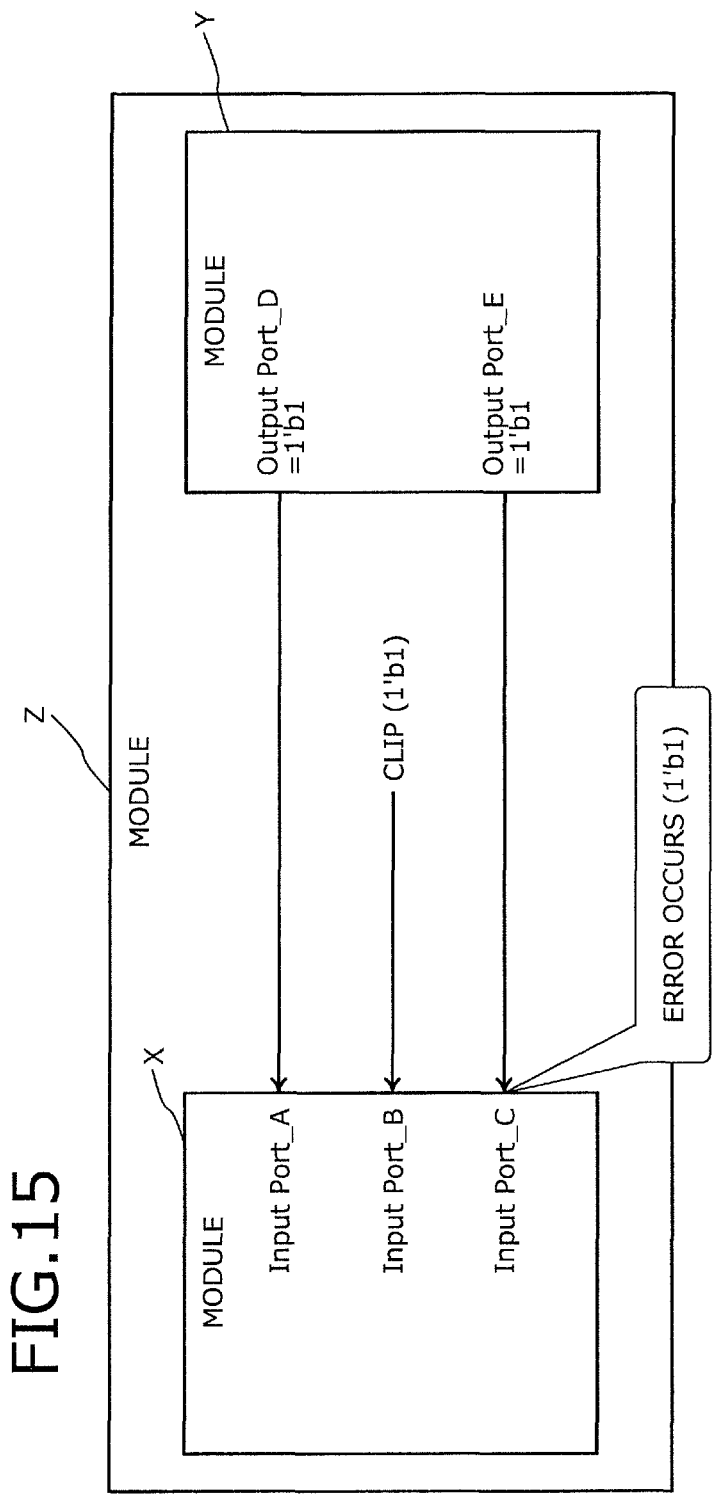
FIG. 15 is an explanatory diagram of results of the determination in determination example 2.

FIG. 15 is an explanatory diagram of results of the determination in determination example 2. Terminal Port_C is connected to terminal Port_E. With the value of terminal Port_E fixed at "1'b1", the value of terminal Port_C becomes "1'b1", the state of terminal Port_C not becoming the high-impedance state, and therefore, an error is output by the assertion.

Thus, the determining apparatus 100 determines whether the state of the first object terminal becomes the high-impedance state by simulating the state of each terminal based on the netlist 1400, enabling verification of the validity of an open terminal by simulation. Therefore, efficient verification can be achieved. Although terminal Port_C of the module X is an open terminal as indicated in the connection specification information 500, nonetheless terminal Port_C may be described as being connected to signal line sig_Number2 as in the instance syntax of the module X in the netlist 700. In this case, it cannot be determined from the instance syntax alone whether signal line sig_Number2 is in the state of being connected to another signal line, terminal, etc., or is in an open state, connected to neither. For this reason, to confirm whether the first object terminal is an open terminal, based on the netlist 700 alone, signal names must be traced back by an operation of the designer and the verification takes time. Thus, according to the determining apparatus 100 of this embodiment, the verification time can be reduced as compared with a case of confirming whether the terminal is an open terminal by the operation of the designer. Therefore, efficient verification related to a terminal connection can be achieved.

Figure 16:
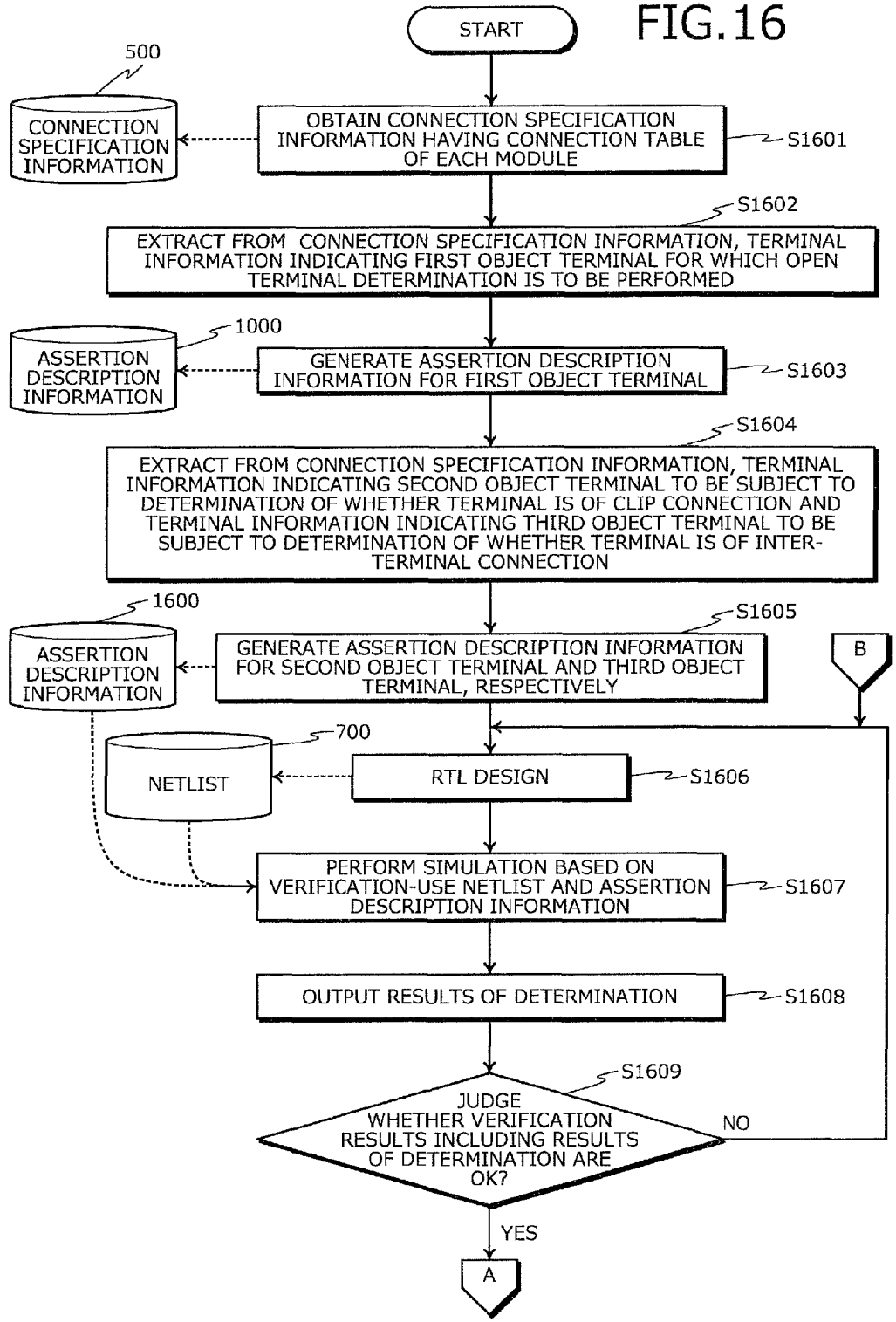
FIGS. 16 and 17 are a flowchart of a procedure example of determination processing by the determining apparatus according to Example 1.
Figure 17:
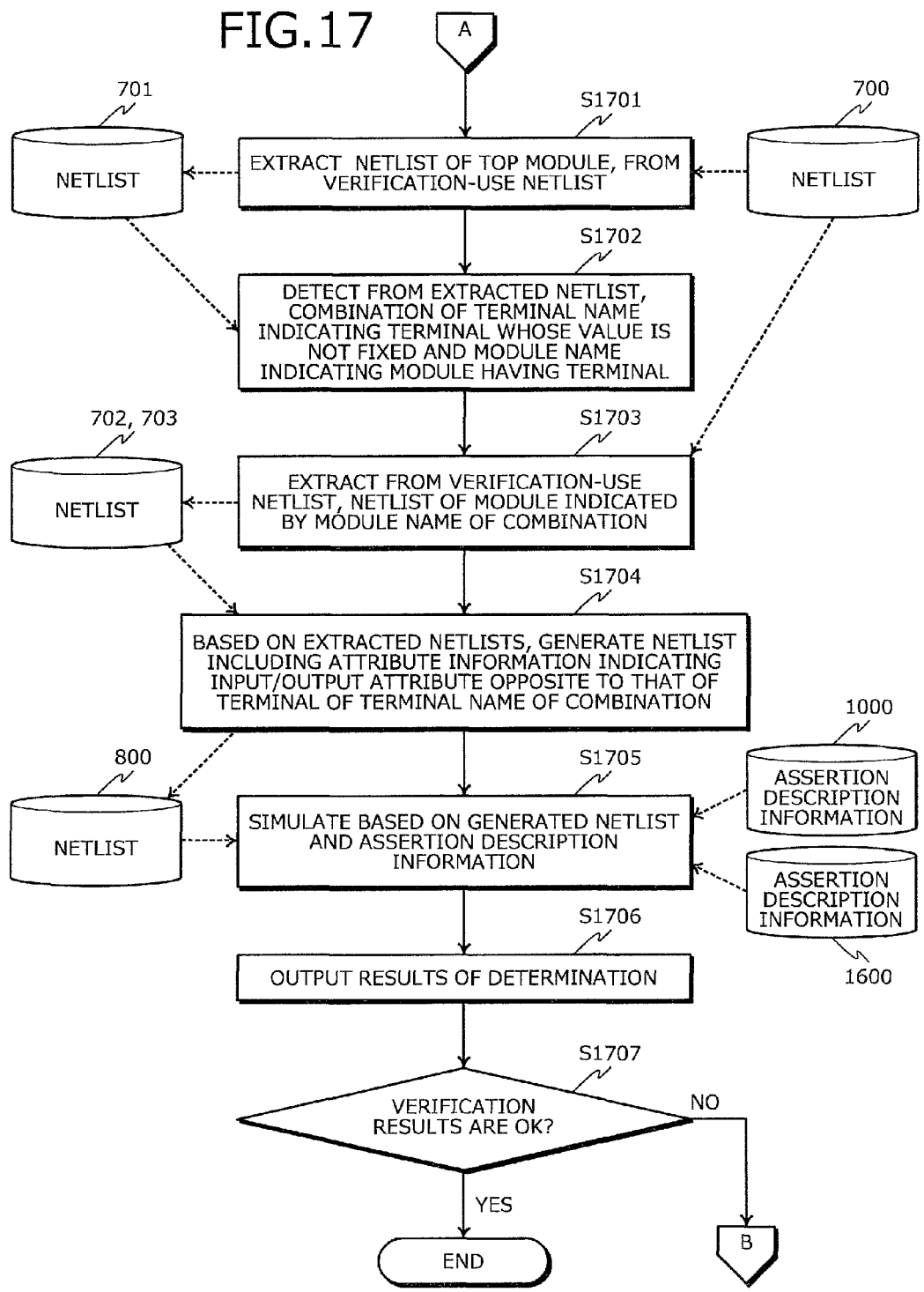

FIGS. 16 and 17 are a flowchart of a procedure example of determination processing by the determining apparatus according to Example 1. In FIGS. 16 and 17, the example depicted will be depicted using the netlist 700 used in determination example 1. The determining apparatus 100 obtains the connection specification information 500 having the connection table of each module (step S1601). The determining apparatus 100 extracts from the connection specification information 500, terminal information indicating a first object terminal for which the open terminal determination is to be performed (step S1602).

The determining apparatus 100 generates the assertion description information 1000 of the first object terminal for which the open terminal determination is to be performed (step S1603). The determining apparatus 100 extracts from the connection specification information 500, terminal information indicating a second object terminal to be subject to determination of whether the terminal is of a clip connection and terminal information indicating a third object terminal to be subject to determination of whether the terminal is of an inter-terminal connection (step S1604). The determining apparatus 100 generates assertion description information 1600 for the second object terminal and the third object terminal, respectively (step S1605).

The determining apparatus 100 performs RTL design by operation of the designer (step S1606). The determining apparatus 100 performs determination with respect to the second object terminal and the third object terminal by performing simulation based on the verification-use netlist 700 and the assertion description information 1600 (step S1607). The determining apparatus 100 outputs results of the determination (step S1608). The determining apparatus 100 judges if verification results including the results of the determination are OK (step S1609). For example, if it is determined that the second object terminal is a terminal of a clip connection and that the third object terminal is a terminal of an inter-terminal connection, then the determining apparatus 100 judges that the results of the verification are OK. Further, if no other error or the like occurs, then the determining apparatus 100 judges that the results of the verification are OK. If it is judged that the results of the verification are not OK (step S1609: NO), then the determining apparatus 100 goes back to step S1606 and re-performs the RTL design.

On the other hand, if it is judged that the results of the verification are OK (step S1609: YES), then the determining apparatus 100 extracts the netlist 701 of a top module, from the verification-use netlist 700 (step S1701). In determination example 1, the top module is the module Z. The determining apparatus 100 then detects from the extracted netlist 701, a combination of a terminal name indicating a terminal whose value is not fixed and a module name indicating a module having the terminal (step S1702). For example, the combination of the module X and terminal Port_A, the combination of the module X and terminal Port_C, and the combination of the module Y and terminal Port_D are detected in the case of determination example 1.

The determining apparatus 100 extracts from the verification-use netlist 700, the netlist of the module indicated by the module name of the combination (step S1703). In determination example 1, the netlist 702 of the module X and the netlist 703 of the module Y are extracted. The determining apparatus 100, based on the extracted netlists 702 and 703, generates the netlist 800 including the attribute information indicating the input/output attribute opposite to that of the terminal of the terminal name of the combination (step S1704). At step S1704, the determining apparatus 100 adds to the netlist 800, output information setting to the specified value, the value of the terminal whose input/output attribute after inversion is the output. The determining apparatus 100 performs the determination with respect to each of the first object terminal, the second object terminal, and the third object terminal by simulation based on the generated netlist 800 and the assertion description information 1000 and 1600 (step S1705).

The determining apparatus 100 outputs results of the determination (step S1706). The determining apparatus 100 judges if the verification results including the determination results are OK (step S1707). For example, if it is determined that the first object terminal is open, that the second object terminal is a terminal of a clip connection, and that the third object terminal is a terminal of an inter-terminal connection, then the determining apparatus 100 judges that the verification results are OK. In determination example 1, the state of terminal Port_C as the first object terminal becomes the high-impedance state and terminal Port_C is determined to be an open terminal. The value of terminal Port_B as the second object terminal becomes "1'b1" and terminal Port_B is determined to be a terminal of a clip connection. The value of terminal Port_E as the second object terminal becomes "1'b0" and terminal Port_E is determined to be a terminal of a clip connection. Since the value of terminal Port_A as the third object terminal and the value of terminal Port_D as the third object terminal match, terminal Port_A and terminal Port_D are determined to be the terminals of an inter-terminal connection. Further, if no other error or the like occurs, the determining apparatus 100 judges that the verification results are OK.

If the verification results are not OK (step S1707: NO), then the determining apparatus 100 goes back to step S1606. If the verification results are OK (step S1707: YES), then the determining apparatus 100 finishes a sequence of processing.

Example 2

In Example 2, the connection specification information 500 is obtained as the first attribute information and the netlist including the second attribute information and the output information are generated based on each connection table included in the connection specification information 500. In Example 2, components identical to those in Example 1 are given same reference numeral used in Example 1 and detailed description of functions and components identical to those in Example 1 is omitted.

Figure 18:
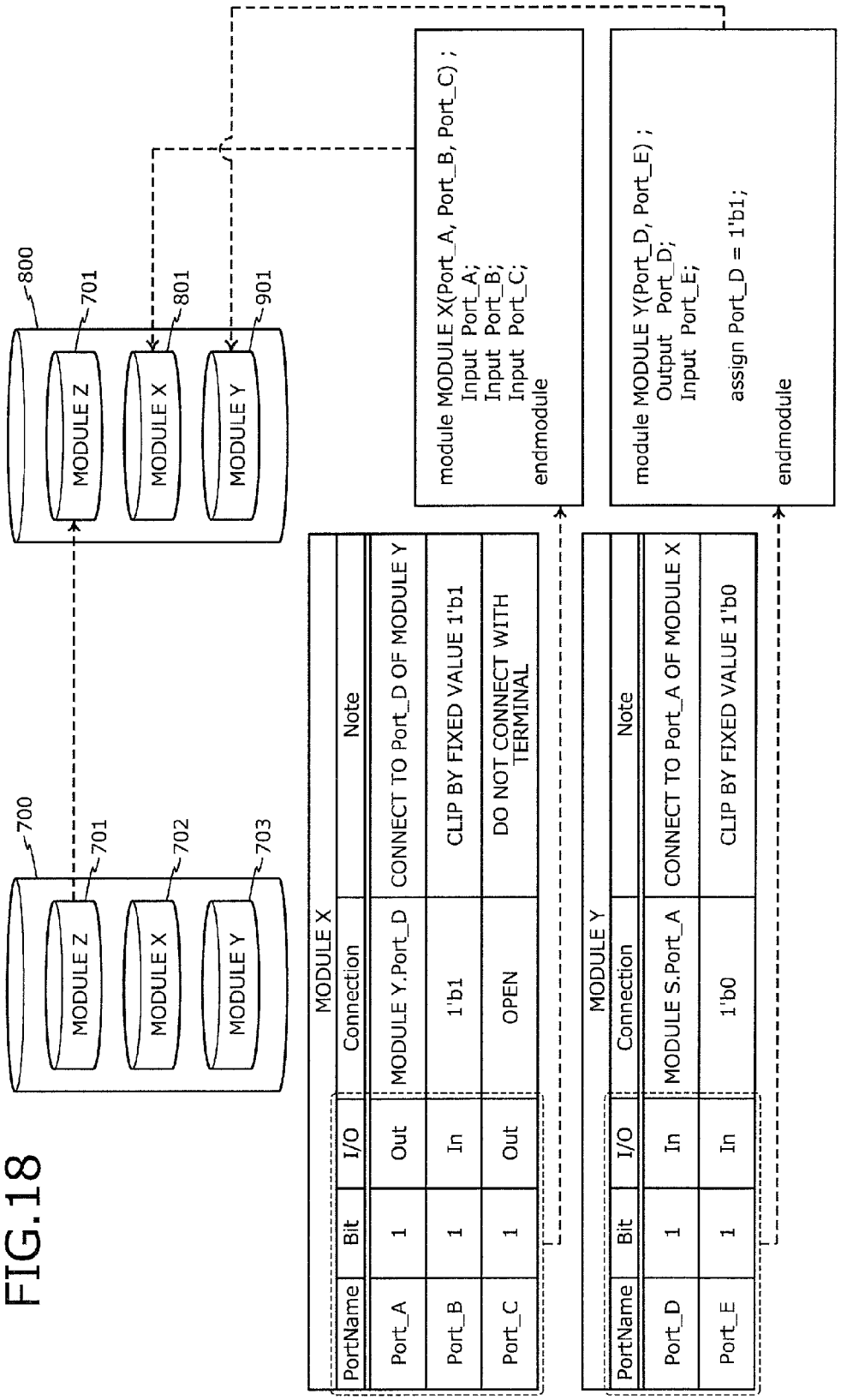
FIG. 18 is an explanatory diagram of a generation example of a netlist according to Example 2.

FIG. 18 is an explanatory diagram of a generation example of a netlist according to Example 2. The netlist generating unit 403 detects from the netlist 701, a combination of the module name of the instance syntax described in the netlist 701 and the terminal name not described as having the fixed value. It is assumed that the combination detected is the same as in determination example 1 described in Example 1.

Among the detected combinations, the netlist generating unit 403 classifies into a same group, the combinations having the same module name. The netlist generating unit 403 generates for each of the groups, a netlist including the second attribute information indicating the input/output attribute made opposite to that of the terminal indicated by the terminal name of the combinations included in the group. For example, based on the module name of the combinations included in the group, the netlist generating unit 403 obtains the connection table from the connection specification information 500.

The netlist generating unit 403 generates the definition statement of the module of the module name of the combinations included in the group. The netlist generating unit 403 then generates the terminal declaration statement of the module definition statement, based on each record in the connection table obtained with respect to the group. The netlist generating unit 403 sets the attribute information to be described in the terminal declaration statement of the module definition statement. Here, the netlist generating unit 403 performs arrangement so that the input/output attribute indicated by the attribute information of the terminal name included in the group will be the input/output attribute opposite to that set in the I/O field included in the record having the terminal name of the combination included in the group. Thus, the netlist generating unit 403 generates the second attribute information.

For example, the netlist generating unit 403 generates the module definition statement, based on the connection table 501 of the module X. The netlist generating unit 403 performs arrangement so that the input/output attribute of terminal Port_A will be the input/output attribute opposite to that set in the I/O field included in the record in the connection table 501 including "Port_A" as the terminal name. The netlist generating unit 403 performs arrangement so that the input/output attribute of terminal Port_C will be the input/output attribute opposite to that set in the I/O field included in the record in the connection table including "Port_C" as the terminal name. Thus, the netlist 801 of the module X is generated. Likewise, the netlist generating unit 403 generates the netlist 901 of the module Y.

FIG. 19 is a flowchart of an example of a procedure of the determination processing by the determining apparatus according to Example 2. Only processing differing between the determination processing by the determining apparatus 100 according to Example 2 and the determination processing by the determining apparatus 100 according to Example 1 will be described. Since processing identical to the processing depicted in FIG. 16 is performed in Example 2, the processing will be described in the case of YES at step S1609.

If it is judged that the results of the verification are OK (step S1609: YES), then the determining apparatus 100 extracts the netlist 701 of a top module, from the verification-use netlist 700 (step S1701). In example above, the top module is the module Z. The determining apparatus 100 then detects from the extracted netlist 701, a combination of a terminal name indicating a terminal for which no fixed value is set and a module name indicating a module having the terminal (step S1902).

The determining apparatus 100 extracts from the connection specification information 500, the connection tables 501, 511 of the module indicated by the module name of the combination (step S1903). The determining apparatus 100, based on the extracted connection tables 501, 511, generates the netlist 800 including the attribute information indicating the input/output attribute opposite to that of the terminal of the terminal name of the combination (step S1904). The determining apparatus 100 performs the determination with respect to each of the first object terminal, the second object terminal, and the third object terminal by simulation based on the generated netlist 800 and the assertion description information 1000 and 1600 (step S1905).

The determining apparatus 100 outputs results of the determination (step S1906). The determining apparatus 100 judges if the verification results including the determination results are OK (step S1907). For example, if it is determined that the first object terminal is an open terminal, that the second object terminal is a terminal of a clip connection, and that the third object terminal is a terminal of an inter-terminal connection, then the determining apparatus 100 judges that the verification results are OK. Further, if no other error or the like occurs, the determining apparatus 100 judges that the verification results are OK. If the verification results are not OK (step S1907: NO), then the determining apparatus 100 goes back to step S1606. If the verification results are OK (step S1907: YES), then the determining apparatus 100 finishes a sequence of processing.

As described, the determining apparatus according to this embodiment determines whether the state of the first object terminal becomes the high-impedance state by simulating the state of each terminal when the input/output attribute of each terminal in the netlist is inverted and the value of the terminal that has come to have the output attribute is set at a specified value. Consequently, it becomes possible to verify the validity of an open terminal by the simulation. Therefore, efficient verification related to terminal connections can be achieved.

The input terminal whose value becomes a fixed value in the netlist is not connected to a given terminal subject to determination of whether the terminal becomes an open terminal. Therefore, the determining apparatus according to this embodiment does not invert the input/output attribute of a terminal whose value becomes a fixed value and simulates the state of a terminal whose input/output attribute has been inverted. Thus, it becomes possible to exclude from the simulation, terminals having no effect on the determination of whether the first object terminal has become an open terminal, thereby achieving efficient verification.

The determining apparatus according to this embodiment further determines whether the second object terminal to be subject to determination of whether the terminal becomes a terminal of a clip connection is fixed at a specified value by simulating the state of each terminal without inverting the input/output attribute of a terminal whose value becomes a fixed value in the netlist. Thus, the determination of whether a terminal becomes a terminal of a clip connection and the determination of whether a terminal becomes an open terminal can be verified by the same simulation. Thus, it becomes possible to achieve efficient verification.

The determining apparatus according to this embodiment outputs indication that the first object terminal is an open terminal when the state of the first object terminal becomes the high-impedance state and outputs indication that the first object terminal is not an open terminal when the state of the first object terminal does not become the high-impedance state. Thus, it becomes easier to judge whether the first object terminal is an open terminal.

According to this embodiment, the validity can be verified with respect to all of the three types of connections between modules. Therefore, the failures that can occur due to erroneous terminal connections between the modules can be reduced and the design quality can be enhanced.

The determining program described in this embodiment can be implemented by a prepared program being executed by a computer such as a personal computer or a workstation. This determining program is recorded on a non-transitory, computer-readable recording medium such as a disk and universal serial bus (USB) memory and is executed by being read out from the recording medium by the computer. The determining program may be distributed by way of a network such as the Internet.

According to one aspect of the embodiments, efficient verification can be achieved.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A determining method comprising:
   obtaining terminal information indicating a first object terminal that is among terminals included in a plurality of partial circuits and subject to determination of whether the first object terminal is an open terminal;
   obtaining for each of the terminals, connection information and first attribute information indicating an attribute of any one among an input terminal and an output terminal;
   generating, by a computer, for each of the terminals, second attribute information indicating an attribute opposite to the attribute indicated by the obtained first attribute information; and
   determining, by the computer, whether a state of the first object terminal indicated by the terminal information becomes a high-impedance state, by simulating on the basis of the obtained connection information and the generated second attribute information, a state of each of the terminals when a value of a terminal that is among the terminals and indicated as being an output terminal by the second attribute information, is set at a first specified value.

2. The determining method according to claim 1, wherein
   the generating includes refraining from generating the second attribute information for a first terminal that is among the terminals and whose input value is a fixed value, on the basis of the obtained connection information, and
   the determining includes determining whether the state of the first object terminal becomes the high-impedance state, on the basis of the connection information obtained and the second attribute information generated, respectively, for second terminals that are among the terminals and other than the first terminal.

3. The determining method according to claim 2, comprising
   obtaining second terminal information indicating a second object terminal subject to determination of whether the second object terminal is of a clip connection, the second object terminal being among the terminals and different from the first object terminal, wherein
   the determining includes determining whether a value of the second object terminal indicated by the second terminal information comes to have a second specified value, by simulating the state of each of the terminals on the basis of the connection information obtained for each of the terminals, the first attribute information obtained for each of the first terminals, and the second attribute information generated for each of the second terminals.

4. The determining method according to claim 1, comprising:
   outputting information indicating that the first object terminal is an open terminal when the state of the first object terminal becomes the high-impedance state; and
   outputting information indicating that the first object terminal is not an open terminal when the state of the first object terminal does not become the high-impedance state.

5. A non-transitory, computer-readable recording medium storing a determining program that causes a computer to execute a process comprising:
   obtaining terminal information indicating a first object terminal that is among terminals included in a plurality of partial circuits and subject to determination of whether the first object terminal is an open terminal;
   obtaining for each of the terminals, connection information and first attribute information indicating an attribute of any one among an input terminal and an output terminal;
   generating for each of the terminals, second attribute information indicating the attribute opposite to that indicated by the obtained first attribute information; and
   determining whether a state of the first object terminal indicated by the terminal information becomes a high-impedance state, by simulating on the basis of the obtained connection information and the generated second attribute information, a state of each of the terminals when a value of a terminal that is among the terminals and indicated as being an output terminal by the second attribute information, is set at a first specified value.

6. The non-transitory, computer-readable recording medium according to claim 5, wherein
   the generating includes refraining from generating the second attribute information for a first terminal that is among the terminals and whose input value is a fixed value, on the basis of the obtained connection information, and the determining includes determining whether the state of the first object terminal becomes the high-impedance state, on the basis of the connection information obtained and the second attribute information generated, respectively, for second terminals that are among the terminals and other than the first terminal.

7. The non-transitory, computer-readable recording medium according to claim 6, the process comprising obtaining second terminal information indicating a second object terminal subject to determination of whether the second object terminal is of a clip connection, the second object terminal being among the terminals and different from the first object terminal, wherein the determining includes determining whether a value of the second object terminal indicated by the second terminal information comes to have a second specified value, by simulating the state of each of the terminals on the basis of the connection information obtained for each of the terminals, the first attribute information obtained for each of the first terminals, and the second attribute information generated for each of the second terminals.

8. The non-transitory, computer-readable recording medium according to claim 5, the process comprising:

outputting information indicating that the first object terminal is an open terminal when the state of the first object terminal becomes the high-impedance state; and outputting information indicating that the first object terminal is not an open terminal when the state of the first object terminal does not become the high-impedance state.

9. A determining apparatus comprising
a processor configured to:

obtain terminal information indicating a first object terminal that is among terminals included in a plurality of partial circuits and subject to determination of whether the first object terminal is an open terminal;

obtain for each of the terminals, connection information and first attribute information indicating an attribute of any one among an input terminal and an output terminal;

generate for each of the terminals, second attribute information indicating the attribute opposite to that indicated by the obtained first attribute information; and determine whether a state of the first object terminal indicated by the terminal information becomes a high-impedance state, by simulating on the basis of the obtained connection information and the generated second attribute information, a state of each of the terminals when a value of a terminal that is among the terminals and indicated as being an output terminal by the second attribute information, is set at a first specified value.

10. The determining apparatus according to claim 9, wherein the processor refrains from generating the second attribute information for a first terminal that is among the terminals and whose input value is a fixed value, on the basis of the obtained connection information, and the processor determines whether the state of the first object terminal becomes the high-impedance state, on the basis of the connection information obtained and the second attribute information generated, respectively, for second terminals that are among the terminals and other than the first terminal.

11. The determining apparatus according to claim 10, the process configured to obtain second terminal information indicating a second object terminal subject to determination of whether the second object terminal is of a clip connection, the second object terminal being among the terminals and different from the first object terminal, wherein the processor determines whether the second object terminal indicated by the second terminal information comes to have a second specified value, by simulating the state of each of the terminals on the basis of the connection information obtained for each of the terminals, the first attribute information obtained for each of the first terminals, and the second attribute information generated for each of the second terminals.

12. The determining apparatus according to claim 9, the processor configured to:

output information indicating that the first object terminal is an open terminal when the state of the first object terminal becomes the high-impedance state; and output information indicating that the first object terminal is not an open terminal when the state of the first object terminal does not become the high-impedance state.

* * * * *